(12) United States Patent
Kyomasu et al.

(10) Patent No.: US 6,422,448 B2
(45) Date of Patent: Jul. 23, 2002

(54) ULTRASONIC HORN FOR A BONDING APPARATUS

(75) Inventors: Ryuichi Kyomasu, Kodaira; Shinichi Nishiura, Fussa, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/822,924

(22) Filed: Mar. 30, 2001

(30) Foreign Application Priority Data

Apr. 6, 2000 (JP) ........................................ 2000-104980

(51) Int. Cl.[7] ............................................... B23K 20/10
(52) U.S. Cl. ......................................... 228/1.1; 228/4.5
(58) Field of Search ........................... 228/1.1, 4.5, 55; 156/580.1; 248/316.1, 539, 541; 403/373, 290, 256

(56) References Cited

U.S. PATENT DOCUMENTS 5,180,093 A * 1/1993 Stansbury et al. ........... 228/1.1
5,275,324 A * 1/1994 Yamazaki et al. ............ 228/1.1
5,368,216 A * 11/1994 Sakakura et al. ......... 156/580.1
6,135,338 A * 10/2000 Kyomasu et al. ............ 228/1.1

FOREIGN PATENT DOCUMENTS

| JP | H6-283578 | 10/1974 |
| JP | H5-59840  | 8/1993  |
| JP | H6-163648 | 6/1994  |
| JP | H11-121546 | 4/1999 |

* cited by examiner

Primary Examiner—Tom Dunn
Assistant Examiner—Jonathan Johnson
(74) Attorney, Agent, or Firm—Koda & Androlia

(57) ABSTRACT

An ultrasonic horn used in, for instance, a bonding apparatus, being provided with a capillary attachment hole formed so as to be smaller than the capillary and a jig insertion hole that communicates with the capillary attachment hole. By way of inserting a jig into the jig insertion hole, the jig insertion hole is pushed open that causes the capillary attachment hole to be widened, so that the capillary is inserted and received in this enlarged capillary attachment hole. The capillary is fastened in place by the elastic force that is generated when the capillary attachment hole returns to its original shape, and the capillary is held in the horn main body without using any fastening tools.

4 Claims, 3 Drawing Sheets

ULTRASONIC HORN FOR A BONDING APPARATUS

BACKGROUND OF THE INVENTION

1. Field of the Invention

The present invention relates to an ultrasonic horn used in a bonding apparatus and more particularly to an ultrasonic horn that transmits ultrasonic vibrations to a capillary with a bonding wire passing therethrough.

2. Prior Art

In ultrasonic horns used in, for instance, a wire bonding apparatus, a capillary is fastened in a capillary attachment hole that is formed in the tip end portion of the horn main body. Conventional capillary fastening structures can be categorized into two types.

In the first type, a slit is formed vertically along the axial center of the horn main body in a portion of the capillary attachment hole, and the capillary is fastened in place by tightening the area surrounding this slit with a bolt. This type of fastening structure is disclosed in, for instance, Japanese Patent Application Laid-Open (Kokai) Nos. H6-163648, H6-283578 and H11-121546. In particular, in Japanese Patent Application Laid-Open (Kokai) No. H6-163648, the ultrasonic horn is formed with a slit, and it is further provided with a stress compensation hole that is larger than the capillary mounting hole. In Japanese Patent Application Laid-Open (Kokai) No H6-283578, a trench is formed in the ultrasonic horn so that it works in a bifurcated fashion. In Japanese Patent Application Laid-Open (Kokai) No H11-121546, a capillary-holding hole is formed at one end of the ultrasonic horn, and a vertical slit is provided from this hole in the opposite side t the tip end of the horn.

In the second type, a slit is formed so as to extend through the capillary attachment hole from the tip end of the horn main body, the area of the capillary attachment hole is endowed with an elastic force, and a screw hole is formed on one side of the slit. A bolt is screwed into the screw hole and tightened. When the bolt is thus tightened, the other side of the slit is pressed so that the slit and capillary attachment hole are widened. After the capillary is inserted into the capillary attachment hole, the bolt is loosened and removed from the horn main body. As a result, the capillary is fastened in place only by the elastic force of the horn main body. This fastening structure is described in Japanese Utility Model Application Laid-Open (Kokai) No. H5-59840.

However, the above capillary fastening structures have problems.

The first type fastening structure has the following problems:

(1) Since the structure involves a bolt that is used to fasten the capillary to the horn main body, the masses on the left and right sides of the horn main body with respect to the axial center of the horn main body are different. As a result, the ultrasonic vibration at the tip end portion is disturbed, and the accurate transmission of ultrasonic waves to the capillary is hindered.

(2) The bolt and the screw hole in the horn main body wear with time. As a result, changes in the configuration of the ultrasonic vibration occur, causing the capillary tightening force to be unstable.

(3) The tightening torque of the bolt must be sufficiently strong so that the bolt itself does not show any relative movement or slippage with respect to the horn main body. Such a relative movement or slippage is derived, for instance, from the bolt becoming loose during the bonding operation and from wear in the bolt. The limit of the tightening torque of the bolt is determined by the size and strength of the head of the bolt that is used for tightening. Currently, the diameter of the head of the bolt generally used in such cases is approximately 3 mm, and this bolt head can withstand a torque of approximately 2 kg. However, in ultrasonic vibration at 80 kHz, the weight of the bolt itself is too heavy. Thus, with the tightening torque of approximately 2 kg, the tightening force is overcome by the force arising from the acceleration of the ultrasonic vibration, thus causing the bolt to slip on the horn main body, and further causing wear of the bolt, energy loss and unstable vibration. Furthermore, with the tightening torque of approximately 2 kg, the shock generated by gravitational acceleration during movement of the capillary cannot be suppressed when ultrasonic oscillation is at 100 kHz, thus causing unstable vibrations in the capillary.

(4) The bolt is generally tightened using a torque driver in order to ensure a constant tightening force. However, torque drivers are expensive, and also they have drawbacks of showing changes in tightening torque unless periodically adjusted. As a result, troubles such as faulty tightening, etc. can occur easily.

The second type fastening structure has the following problems:

(1) Since a screw hole is formed on one side of the slit, the masses on the left and right sides of the horn main body with respect to the axial center of the horn main body are different as in the above first type. Thus, the ultrasonic vibration at the tip end portion is disturbed, hindering the accurate transmission of ultrasonic waves to the capillary.

(2) In order to ensure a sufficient grip in the tip end portion of the horn main body that is open, it is necessary to increase the thickness of the tip end portion so as to increase the elastic force of the horn main body. However, in the structure for gripping the capillary from the left and right sides, the capillary may be damaged before a sufficient gripping force is applied to the capillary.

(3) Furthermore, so as to transmit ultrasonic vibration efficiently from the vibrator provided in the rear portion of the horn main body, it is generally necessary to design the tip end portion of the horn main body slender. There are restrictions also on the diameter and length dimensions of the horn main body in view of performance. Currently, the thickness of the capillary gripping portion located in the tip end portion of an ordinary horn main body is approximately 1 mm. The elastic force obtained from such a thickness is easily overcome by the shock generated by gravitational acceleration during movement of the capillary in ultrasonic oscillation at 60 kHz or greater; and as a result, the capillary is not retained.

(4) Since the tip end portion of the horn main body is opened by a slit, such a tip end portion is caused to undergo repeated slight expansions and contractions by the ultrasonic vibration. As a result, tensile and compressive stresses are generated inside the capillary, causing cracks, failing to generate a sufficient holding force. Furthermore, destructive accidents can occur as a result of changes in strength, etc. even in ordinary use.

BRIEF SUMMARY OF THE INVENTION

Accordingly, the object of the present invention is to provide an ultrasonic horn for a bonding apparatus that suppresses the generation of unnecessary vibrations other than the ultrasonic vibration at the fundamental frequency, improves the bondability, and realizes stable gripping for the capillary by a simple structure.

The above-object is accomplished by a unique structure for an ultrasonic horn used in a bonding apparatus in which a capillary is fastened in a capillary attachment hole formed in the tip end portion of the horn main body, and in the present invention:

the capillary attachment hole is formed smaller than the capillary in diameter, a jig insertion hole is formed in the horn main body so as to communicate with the capillary attachment hole, and the area surrounding the capillary attachment hole and jig insertion hole is formed as a closed structure, and wherein the jig insertion hole is pushed open using a jig, thus widening the capillary attachment hole so that the capillary attachment hole becomes larger than the capillary and the capillary is inserted into the capillary attachment hole, and the capillary is fastened in place by the elastic force generated when the capillary attachment hole returns to its original shape, without requiring any component other than the horn main body for holding the capillary.

In the above structure, the horn main body is formed so that it is symmetrical with respect to its own axial center.

Furthermore, the jig insertion hole communicates with the capillary attachment hole either directly or via a slit.

DETAILED DESCRIPTION OF THE INVENTION

Embodiments of the present invention will be described with reference to the accompanying drawings.

Figure 1A:
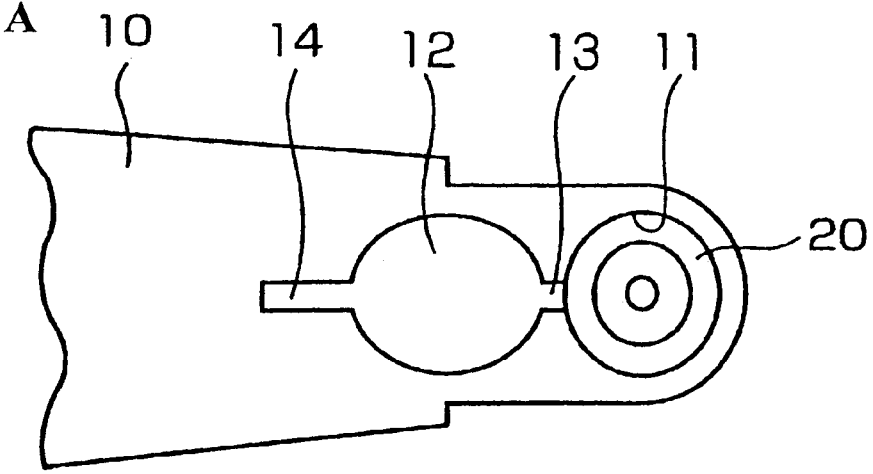
FIG. 1A is a top view of the ultrasonic horn for a bonding apparatus according to one embodiment of the present invention, FIG. 1B being a front view thereof.
Figure 1B:
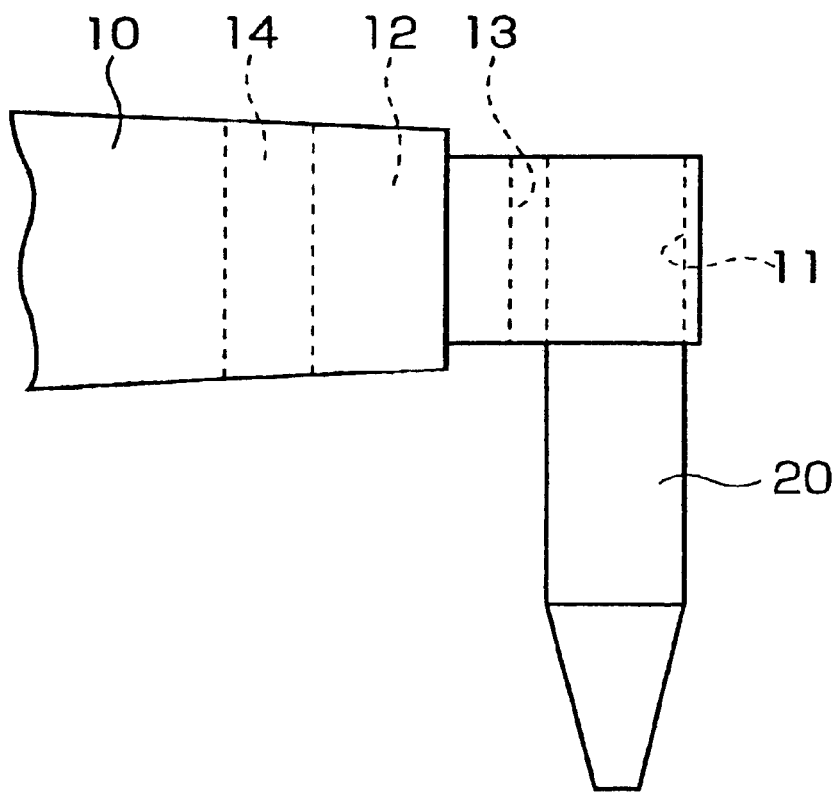

FIGS. 1A and 1B show a capillary 20 and a horn main body 10 in which the capillary 20 is installed. As seen form FIGS. 1A and 1B, the horn main body 10 is formed with a capillary attachment hole 11 and an elliptical or oval jig insertion hole 12. The capillary attachment hole 11 receives the capillary 20 and fastens the capillary 20 in place. As best seen from FIG. 1B, the capillary attachment hole 11 is formed vertically in the tip end portion of the horn main body 10. The elliptical jig insertion hole 12 is formed in the horn main body 10 so as to be located on the opposite side of the capillary attachment hole 11 from the tip end portion of the horn main body 10. The jig insertion hole 12 communicates with the capillary attachment hole 11 via a vertical slit 13 formed in between. Furthermore, a slit 14 is formed vertically in a part of the jig insertion hole 12 located on the opposite side of the attachment hole 11 from the slit 13.

Thus, the capillary attachment hole 11, slit 13, jig insertion hole 12 and slit 14 are formed continuously in a closed structure by the edges of these elements. Furthermore, the horn main body 10 is formed so as to be symmetrical with respect to its own center axis that extends in the direction of length thereof.

Figure 2A:
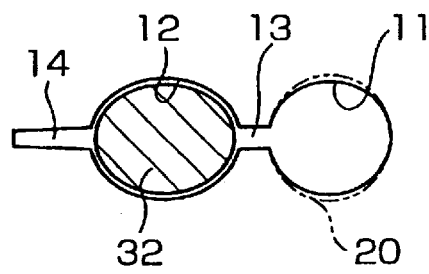
FIGS. 2A, 2B, 2C and 2D illustrate the steps of fastening the capillary in the capillary attachment hole.
Figure 2B:
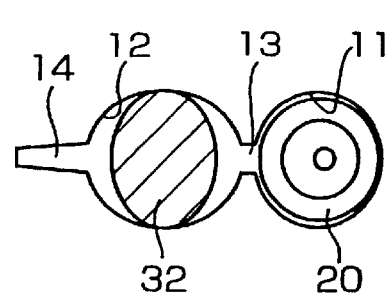
Figure 2C:
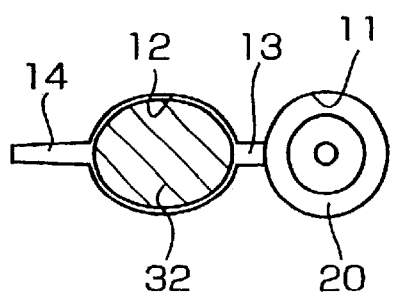
Figure 2D:
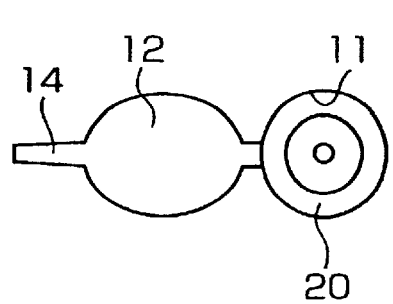

As seen from FIGS. 1A, 1B and 2D, when the capillary 20 is fastened to the horn main body 10, the capillary 20 is gripped by the elastic force of the horn main body 10 in the area surrounding the capillary attachment hole 11. For this reason, as seen from FIG. 2A, the capillary attachment hole 11 (or its inner diameter) is slightly smaller (by approximately 200 $\mu$m) than the external diameter of the capillary 20.

Figure 3A:
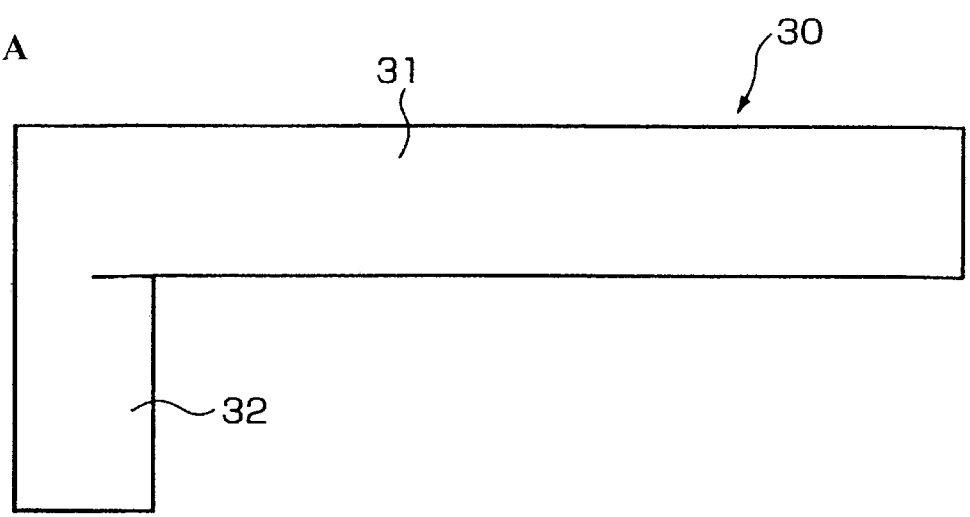
FIG. 3A is a front view of the jig used in the present invention, FIG. 3B being a bottom view thereof.
Figure 3B:
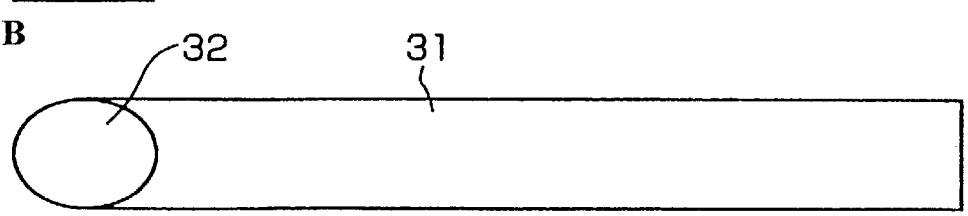

FIGS. 3A and 3B show a jig 30 that is to be inserted into the jig insertion hole 12 so as to push the jig insertion hole 12 open or wider. The jig 30 comprises an operating lever 31 and an insertion hole pressing portion 32 that is disposed on the undersurface of one end of the operating lever 31. The insertion hole pressing portion 32 has an elliptical shape in its horizontal cross-section as best seen from FIG. 3B. The pressing portion 32 is slightly smaller than the jig insertion hole 12.

The manner of fastening the capillary 20 to the horn main body 10 will be described below with reference to FIGS. 2A through 2D.

As shown in FIG. 2A, the insertion hole pressing portion 32 of the jig 30 is first inserted in the jig insertion hole 12 of the horn main body 10. Then, the operating lever 31 of the jig 30 is turned 90 degrees. When the operating lever 31 is thus turned 90 degrees, the jig insertion hole 12 and slit 13 are pushed away so as to be wider by the insertion hole pressing portion 32 as shown in FIG. 2B. As a result, the capillary attachment hole 11 is widened, and it becomes larger in diameter than the diameter of the capillary 20.

Then, the capillary 20 is inserted into the capillary attachment hole 11, and the operating lever 31 of the jig 30 is turned 90 degrees further (or back) so that the insertion hole pressing portion 32 is returned to its original position. Thus, as a result of the elastic force that causes the jig insertion hole 12, slit 13 and capillary attachment hole 11 to return to their original states shown in FIG. 2A, the capillary 20 in gripped by the capillary attachment hole 11 as shown in FIG. 2C. Then, the insertion hole pressing portion 32 of the jig 30 is removed from the jig insertion hole 12, thus completing the fastening of the capillary 20 to the horn main body 10. When the capillary 20 is to be removed from the horn main body 10, an operation that is the reverse of the steps described above is performed.

In the above embodiment, a bolt such as that used in the above-described first type fastening structure is not used. Also, a screw hole such as that used in the second type fastening structure is not formed. As a result, the masses on the left and right of the horn main body 10 with respect to the axial center of the horn main body 10 are the same, and the disturbance of the vibration is eliminated. Furthermore no unnecessary vibration is generated, and the loss of energy is eliminated. In addition, naturally no bolt or screw hole wear occurs, and the horn main body 10 is not worn out, so that changes in the shape of the horn main body 10 that would be caused over time by repeated replacement of the capillary 20 is eliminated. Thus, a stable use of the capillary can be assured over a long period of time. Furthermore, since there is no need for a screw hole, and no need for fastening bolts, the horn main body 10 can be manufactured inexpensively.

In addition, there is no need to use an expensive torque driver, etc. in order to ensure that the torque is constant when the screw is tightened as in the first type fastening structure. Thus, a constant gripping force is obtained by the jig 30 that is of a simple structure when a new capillary 20 is fastened in the horn main body 10.

The test for the structure of the above embodiment indicates that the horn main body 10 holds the capillary 20 with a gripping force that is more than three times the gripping force obtained by the first type fastening structure of the prior art. For example, when the bolt of the first type fastening structure is tightened with a torque of 1.5 kg, then the gripping force of the capillary attachment hole is approximately 50 N. However, the gripping force of the capillary attachment hole 11 of the horn main body 10 of the shown embodiment is greater than 150 N.

In regard to shocks generated from the gravitational acceleration that occurs during the movement of the capillary 20, in the case of an oscillation amplitude of 4 $\mu$m, for instance, the shock from gravitational acceleration at 150 kHz is 90 N, and the shock generated from gravitational acceleration at 180 kHz is 130 N. In the shown embodiment of the present invention, the capillary 20 is held by a sufficient gripping force of 150 N or more even in the case of an ultrasonic vibration of 100 kHz or greater, in which the shock is extremely large. Accordingly, the ultrasonic waves can be accurately transmitted to the object of vibration.

Furthermore, in the above embodiment, the capillary 20 is gripped by the capillary attachment hole 11 in which the tip end of the horn main body 10 is closed and not open as best seen from FIG. 1A. Accordingly, a gap in the capillary attachment hole 11 is prevented; and even in the case that capillaries of different diameters are to be fastened, three or more contact points are guaranteed between the capillary and the capillary attachment hole 11. Thus, stable fastening of the capillary is constantly assured. furthermore,the capillary 20 can be fastened in place by a simple and easy mounting method without using any precision tools, etc.; and a stable gripping force is applied thereto. Moreover, even if the gripping force on the capillary 20 is increased, only a compressive stress acts on the capillary 20, with no generation of any tensile stress. Thus, the capillary 20 is free from any damage.

Various other embodiments of the present invention will be described with reference to FIGS. 4A through 4F. Parts that are the same as or correspond to those in the above embodiment will be assigned the same reference numerals in the description below.

Figure 4A:
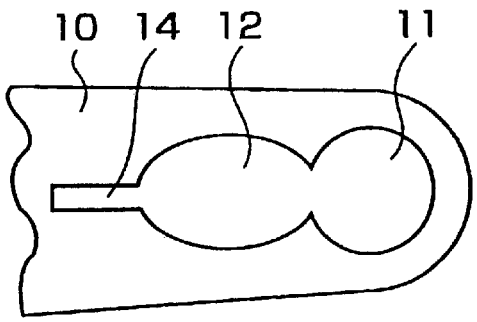
FIGS. 4A through 4F show top views of the horn main bodies according to various embodiments of the present invention.
Figure 4B:
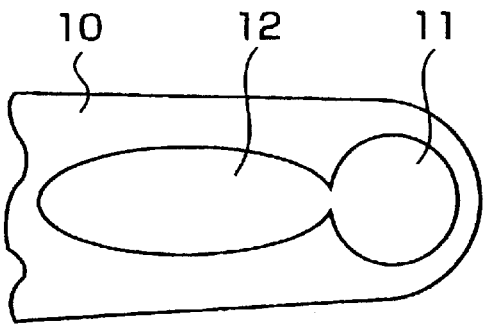

FIGS. 4A and 4B respectively illustrate second and third embodiments of the present invention. Though in the embodiment of FIGS. 1A and 1B the jig insertion hole 12 communicates with the capillary attachment hole 11 via the slit 13, in the embodiments of FIGS. 4A and 4B the jig insertion hole 12 are formed so as to communicate directly with the capillary attachment hole 11, and not slits are formed in between. In the embodiment of FIG. 4B, the jig insertion hole 12 is formed so as to extend to the area of the slit 14 shown in FIGS. 1A and 4A. In other words, there is no slit 14 formed in the horn main body 10 of the embodiment of FIG. 4B.

Figure 4C:
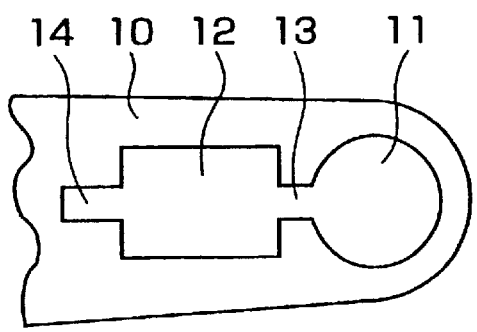

In the fourth embodiment of the present invention shown in FIG. 4C, the jig insertion hole 12 is formed in a rectangular shape. Thus, the jig insertion hole 12 may have any shape that can be pushed open so as to become larger by the jig 30, and there are no particular restrictions on the shape.

Figure 4D:
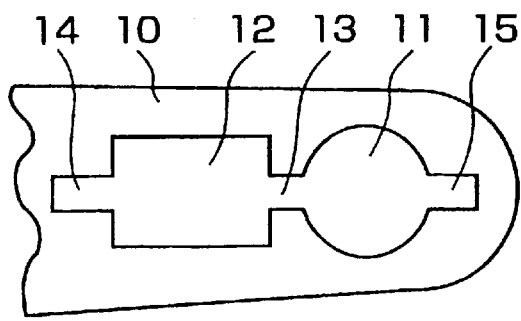

FIG. 4D illustrates the fifth embodiment of the present invention. In this embodiment, there is a certain degree of thickness between the capillary attachment hole 11 and the tip end of the horn main body 10; and a slit 15 is formed in the thick end portion so as to extend toward the tip end of the horn main body 10 from the capillary attachment hole 11. This embodiment is a modification of the fourth embodiment shown in FIG. 4C. It goes, however, without saying that such a slit 15 can be formed in the embodiments shown in FIG. 1, FIG. 4A and FIG. 4B in cases the horn main body 10 has a certain thickness between its tip end and the capillary attachment hole 11.

Figure 4E:
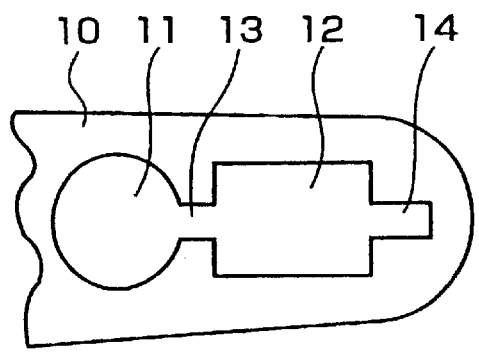
Figure 4F:
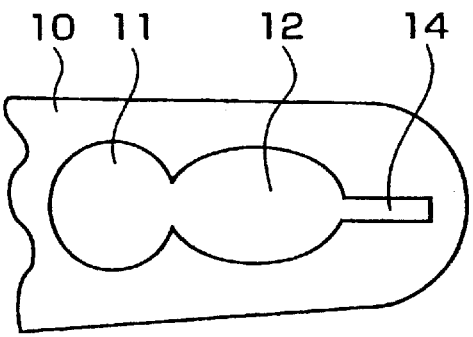

FIGS. 4E and 4F illustrate, respectively, the sixth and seventh embodiments of the present invention. In these embodiments, the portion of the horn main body 10 that is between the capillary attachment hole 11 and the tip end of the horn main body 10 is relatively long, and the jig insertion hole 12 is formed between the capillary attachment hole 11 and the tip end of the horn main body 10. In the embodiment of FIG. 4E, the jig insertion hole 12 is formed so as to communicate with the capillary attachment hole 11 via a slit 13; and in the embodiment of FIG. 4F, the jig insertion hole 12 is formed so as to communicate directly with the capillary attachment hole 11 with no slit 13 in between.

In all of the embodiments shown in FIGS. 4A through 4F, the capillary (not shown) is securely gripped elastically by the capillary attachment hole 11 in the same manner as shown in FIGS. 2A through 2D by way of inserting the jig 30 shown in FIGS. 3A and 3B into the jig insertion hole 12 and then by turning it.

The jig 30 may be any tool as long as it is capable of pushing the jig insertion hole 12 open after inserted in the jig insertion hole 12. Thus, the jig 30 is not limited to the shape shown in FIGS. 3A and 3B.

As seen from the above, in the present invention, the capillary attachment hole smaller in diameter than the capillary is formed in the horn main body, the jig insertion hole that communicates with this capillary attachment hole is formed next to the capillary attachment hole, and the area surrounding the capillary attachment hole and jig insertion hole is formed as a closed structure; and the jig insertion hole is pushed open by a jig, thus widening the capillary attachment hole so that the capillary attachment hole becomes larger in diameter than the capillary, after which the capillary is inserted into the capillary attachment hole, and then the jig is removed from the jig insertion hole so that the capillary is held in place by the elastic force that is generated when the capillary attachment hole returns to its original shape. Thus, no component other than the horn main body is used for fastening the capillary to the horn main body. Also, the generation of unnecessary vibrations other than the ultrasonic vibration at the fundamental frequency is suppressed, the bondability in bonding improves, and stable capillary gripping is realized by means of a simple structure. Further, an inexpensive ultrasonic horn for use in a bonding apparatus can be obtained.

What is claimed is:

1. An ultrasonic horn for a bonding apparatus for holding a capillary at one end of a horn main body of said ultrasonic horn, wherein said horn main body is provided with:

a capillary attachment hole formed in said one end of said horn main body, said capillary attachment hole being smaller in diameter than said capillary, and a jig insertion hole formed in said horn main body so as to communicate with said capillary attachment hole, and wherein said jig insertion hole is pushed open using a jig, thus widening said capillary attachment hole so as to be larger than said capillary so that said capillary is inserted into said capillary attachment hole, and said capillary is fastened in place in said capillary attachment hole by elastic force that is generated when said capillary attachment hole returns to its original shape.

2. The ultrasonic horn for a bonding apparatus according to claim 1, wherein said horn main body is symmetric with respect to an axial center of said horn main body.

3. The ultrasonic horn for a bonding apparatus according to claim 1, wherein said jig insertion hole communicates with said capillary attachment hole with a slit in between.

4. The ultrasonic horn for a bonding apparatus according to claim 1, wherein an area surrounding said capillary attachment hole and jig insertion hole is formed as a closed structure.

* * * * *